United States Patent [19]
Mazzucco et al.

[11] Patent Number: 5,276,405
[45] Date of Patent: Jan. 4, 1994

[54] INTEGRATED INSTRUMENTATION AMPLIFIER FOR BELOW-GROUND INPUTS

[75] Inventors: Michelangleo Mazzucco, Santa Maria Del Tempio; Vanni Poletto, Camino; Marco Morelli, Livorno, all of Italy

[73] Assignee: SGS-Thomson Microelectronics, S.R.L., Agrate Brianza, Italy

[21] Appl. No.: 919,891

[22] Filed: Jul. 27, 1992

[30] Foreign Application Priority Data

Jul. 29, 1991 [IT] Italy .................. TO91A000599

[51] Int. Cl.$^5$ .............................................. H03F 3/45
[52] U.S. Cl. ................................... 330/257; 330/258; 330/259; 330/260; 123/694
[58] Field of Search .................. 330/85, 257, 258, 259, 330/260; 123/694-

[56] References Cited

U.S. PATENT DOCUMENTS

| | | | |
|---|---|---|---|
| 4,232,271 | 11/1980 | Dobkin et al. | 330/258 |
| 4,378,529 | 3/1983 | Dobkin | 330/257 |
| 4,521,739 | 6/1985 | Peterson | 330/257 |

FOREIGN PATENT DOCUMENTS 0045841 6/1981 European Pat. Off. .

OTHER PUBLICATIONS

Electronics Letters, vol. 26, No. 8, Apr. 14, 1990, pp. 543-545 Z. Wang, "Wideband Class AB(Push-Pull) Current Amplifier in CMOS Technology".
IEEE Journal of Solid-State Circuits, vol. 16, No. 6, Dec. 1981, pp. 677-681 B. D. Miller, et al., "Instrumentation Amplifier IC Designed For Oxygen ..."

*Primary Examiner*—James B. Mullins
*Attorney, Agent, or Firm*—Robert Groover

[57] ABSTRACT

An amplifier having a high input dynamic range as well as high CMRR and PSRR values and input impedance while using a single supply voltage, includes an input stage with two transistors which are biased by a constant current, preferably of less than 1 microampere, while the collectors of the transistors are kept at fixed reference voltages. The input signal applied between the emitters of the transistors is transferred to the terminals of a first resistor which is supplied with current from a circuit which mirrors the current into a second resistor, from the terminals of which the output signal is taken.

The preferred application is for forming interfaces for lambda probes fitted to catalytic converters for motor vehicles.

41 Claims, 5 Drawing Sheets

INTEGRATED INSTRUMENTATION AMPLIFIER FOR BELOW-GROUND INPUTS

FIELD OF THE INVENTION

The present invention relates to integrated circuit amplifiers, and particularly to monolithic integrated amplifiers which can accept common-mode input voltages below ground voltage and which also have high input common-mode rejection ratios (CMRR), power-supply rejection ratios (PSRR) and input impedance. The need for such an amplifier arises, for example, in the production of circuits for interfacing between the zirconium dioxide probes (lambda probes) fitted to catalytic converters for motor vehicles with internal combustion engines and the central electronic control units which are fitted in the motor vehicles for controlling their engines, In most applications, the signal of the lambda probe relates to the ground of the converter and varies from 0 to a maximum of about 1 volt. The ground of the probe (which corresponds to that of the converter) is generally different from that of the engine control unit in which the amplifier is housed; this difference is within ±1 volt. Since the connecting wires between the probe and the control unit are long, it is necessary to have a high CMRR in order to reject common-mode interference. Finally, the amplifier has to output a signal which relates to ground and which has an optimal dynamic range for an analog/digital converter (0–4 volts), which means it must have a nominal gain of 4. The probe has a high output impedance and the input impedance of the amplifier therefore has to be high.

A class of amplifiers which is particularly suitable for satisfying the aforementioned characteristics is that of the so-called "Instrumentation Amplifiers".

In this connection, the following references may usefully be consulted:

Rudy J. Van de Plassche, "A wideband monolithic instrumentation amplifier", IEEE J. Solid Circuits, Vol. SC-10, pp. 424–431, December 1975, A. Paul Brokaw, Michael P. Timko, "An improved monolithic instrumentation amplifier", IEEE J. Solid Circuits, Vol. SC-10, pp. 417–423, December 1975, and Bernard D. Miller, Lawrence R. Sample, "Instrumentation amplifier IC designed for oxygen sensor interface requirements", IEEE J. Solid State Circuits, Vol. SC-10, December 1981; all of which are hereby incorporated by reference.

Also, in EP-A-0 045 841 (which is hereby incorporated by reference) a voltage-current converter is disclosed having an input related to ground and an output current which is taken up by the device. The linear proportionality constant is obtained by using exclusively MOS transistors, which are far from being inherently linear.

A wideband current amplifier providing very low input resistance, good large signal behaviour and large bandwidth is disclosed in an article by Z. Wang entitled "Wideband Class AB (Push-Pull) Current Amplifier in CMOS Technology" which appeared in Electronics Letters, Vol. 26, No. 8, Apr. 14, 1990, ENAGE GB, pages 543–545. In that reference, both the input signal and the output signal are current signals. The power supply rejection is low, similar to that of a traditional current-mirror: to improve this a cascode is added.

Most amplifiers of the type specified above, (particularly those described in the first two references cited above), generally have a structure like that illustrated in FIG. 1. In the illustrated structure is a first stage formed by two transistors T1 and T2, the emitters of which are coupled by means of a resistor RG and are connected to respective current generators I1 and I2, and the collectors of which are associated with respective resistors R'1 and R'2. Similarly, the emitters of transistors T3 and T4 of the second stage are coupled by a resistor RS and are connected to respective current generators I3 and I4, and respective resistors R'3 and R'4 are associated with their collectors.

The input signal $V_{IN}$ is applied between the bases of the transistors T1 and T2. A differential amplifier A takes the resulting signal (output signal $V_{out}$) from between the collectors of T1 and T2. Signal $V_{OUT}$, and a reference voltage $V_{REF}$, are applied to the bases of differential pair T3/T4. A further amplifier B transfers the resulting signals present at the collectors of T3 and T4 to control current generators I2, I4 and I1, I3.

These amplifiers may have high input impedance as well as high CMRRs and PSRRs. However, they cannot be used in the context indicated above, since the minimum value of the common-mode voltage of the inputs is equal to $Vbe+Vce(sat) \simeq +1$ V relative to ground (as against the −1 V. required).

The solution presented in the article by Miller and Sample (which is also documented in U.S. Pat. No. 4,232,271, which is hereby incorporated by reference) differs substantially from the other known solutions, precisely in order to satisfy the input common-mode dynamic-range requirement. This amplifier is dedicated for use, preferably, with a lambda probe. In this connection, see the detailed description provided in the U.S. Pat. No. 4,232,271, FIG. 4 of which corresponds to FIG. 2 of the present application). The input stage is formed by the emitters of transistors 18 and 19 which may reach a voltage below ground. The voltages of the collectors of transistors 18 and 19 are kept above the ground potential by means of amplifiers 31, 32 and the reference voltage VREF, thus preventing the substrate diode from conducting (it should be remembered that the amplifiers in question are intended to be integrated). The high input impedance is achieved by biasing the transistors 18 and 19 with a first generator formed by the reference voltage VREF, the resistor 21 and the amplifier 31, and a second generator formed by the same voltage VREF, the resistor 20 and the amplifier 32, respectively. The voltage applied to the inputs (VIN) is transformed into a current I1=VIN/R23, where R23 indicates the resistance of the resistor 23. This current is then mirrored, by means of the circuit formed by the PNP transistors 29b and 33 and by the resistors 35 and 36, into the resistor 16. With this structure, it is necessary, in order to achieve high CMRR and PSRR values, to use a "cascode" for the current-mirror circuit cited above, as well as for the generators of the currents I1=VREF/R21 and I2=VREF/R20 (R21 and R20 are the resistances of the resistors 20 and 21). In fact, the voltages at the terminals of these current generators vary with the input voltage (both common-mode and differential). Although, a "cascode" is possible for I1 and I2, even with a single 5-volt supply, it is not possible for the current-mirror circuit including the transistors 29b and 33 and the resistors 35 and 36 for which, with the use of mirror circuits known in the art, it is necessary to use a second supply in order to have a "cascode" and at the same time not to have errors due to the current for biasing the transistors which are connected to the collector voltage Vcc, and to permit a high input common-mode dynamic range.

SUMMARY OF THE INVENTION

The primary object of the invention is thus to avoid the use of a second supply (for example, in the case of installation in a motor vehicle, the battery) so that the amplifier can be supplied with a single 5-volt supply, while retaining the characteristics of high input impedance and dynamic range with equally high CMRR and PSRR values.

More specifically, according to the present invention, this object is achieved by virtue of an amplifier which has a high input dynamic range as well as high CMRR and PSRR values and input impedance while using a single supply voltage. It includes an input stage with two transistors which are biased by a constant current, preferably of less than 1 microampere, while the collectors of the transistors are kept at fixed reference voltages. The input signal applied between the emitters of the transistors is transferred to the terminals of a first resistor which is supplied with current from a circuit which mirrors the current into a second resistor, from the terminals of which the output signal is taken. The preferred application is for forming interfaces for lambda probes fitted to catalytic converters for motor vehicles.

BRIEF DESCRIPTION OF THE DRAWING

The invention will now be described, purely by way of non-limiting example, with reference to the appended drawings, in which.

DETAILED DESCRIPTION OF THE PREFERRED EMBODIMENTS

Figure 1:
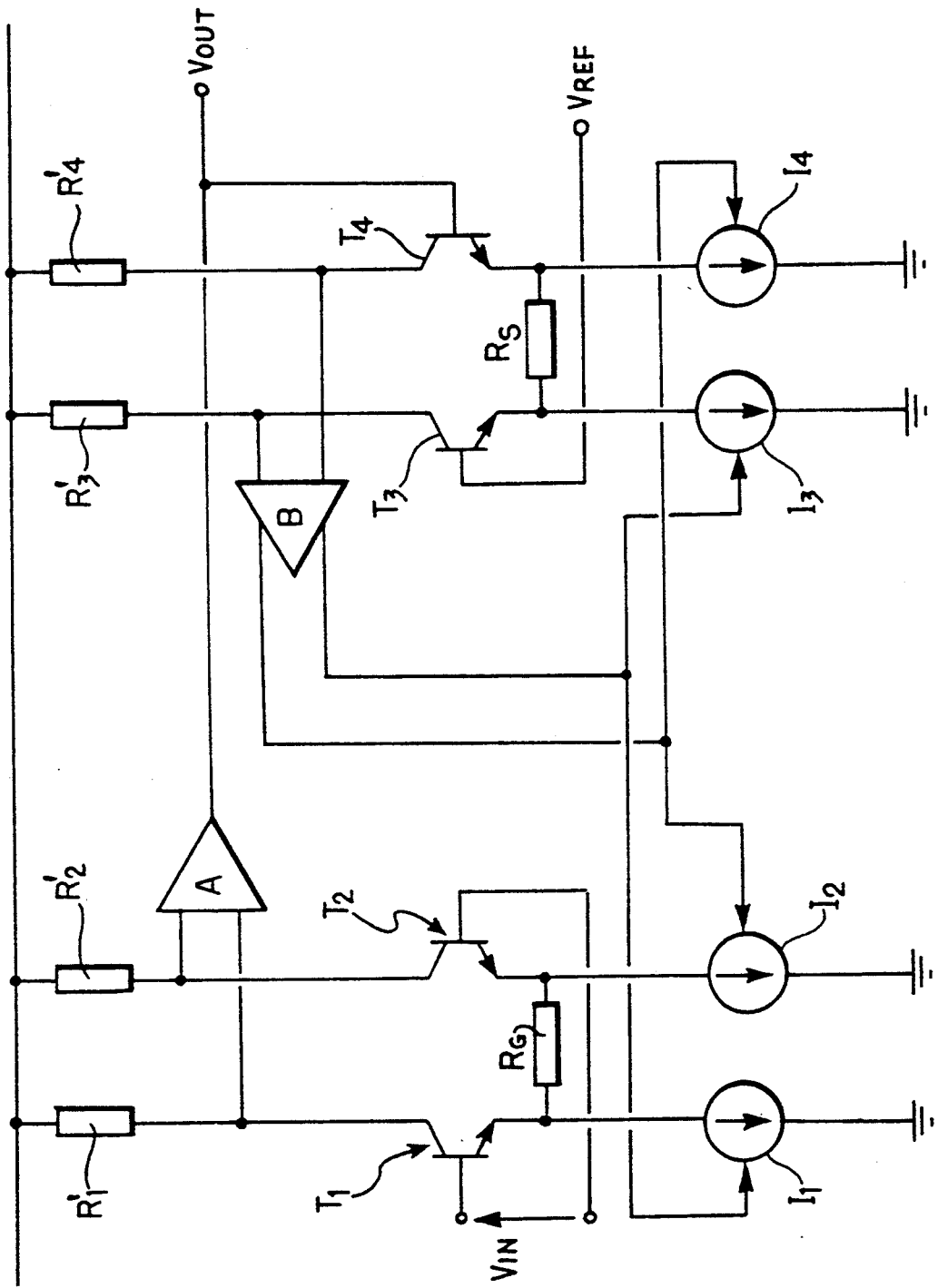
FIGS. 1 and 2, which relate to the prior art, have already been described above.
Figure 2:
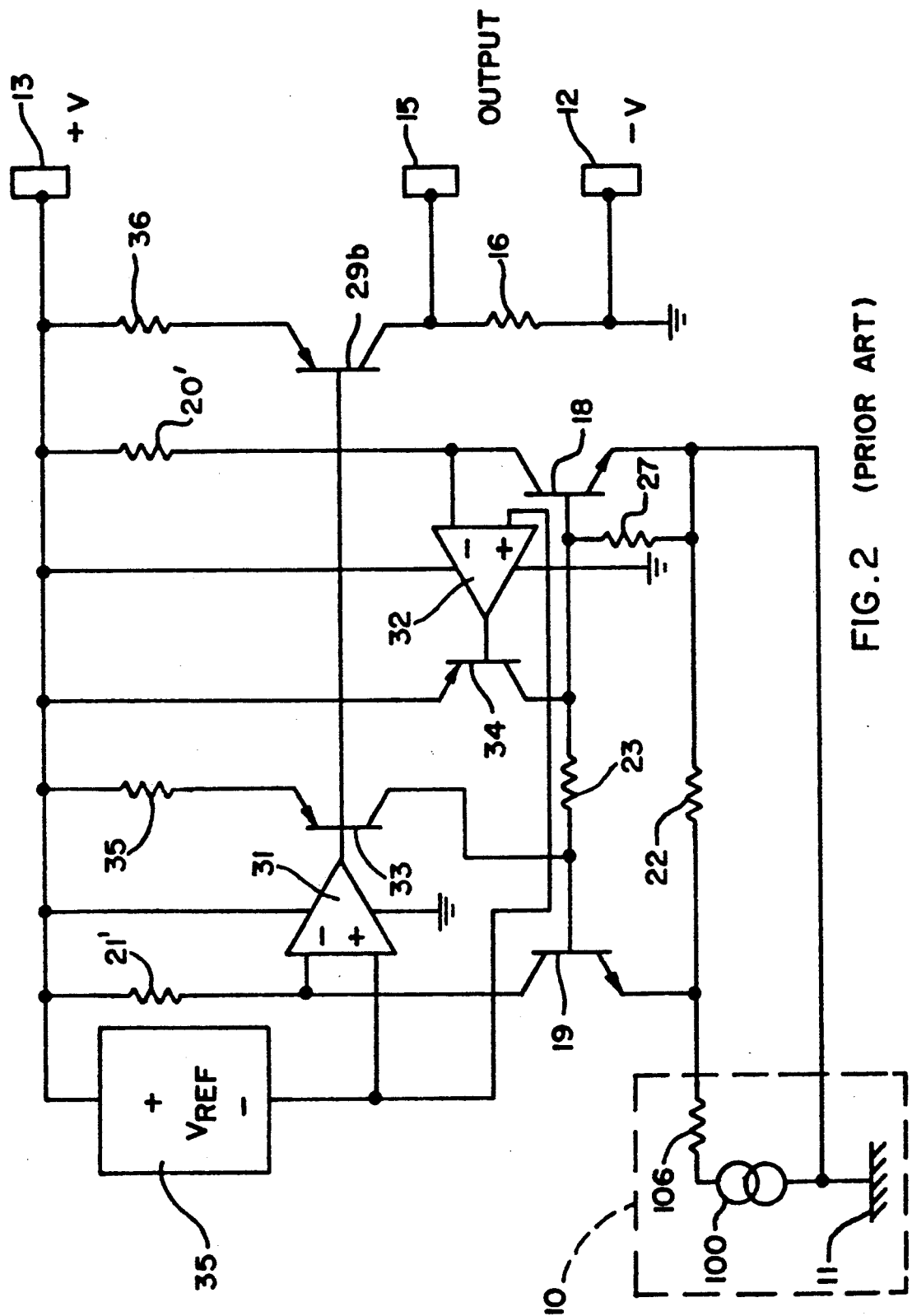
Figure 3:
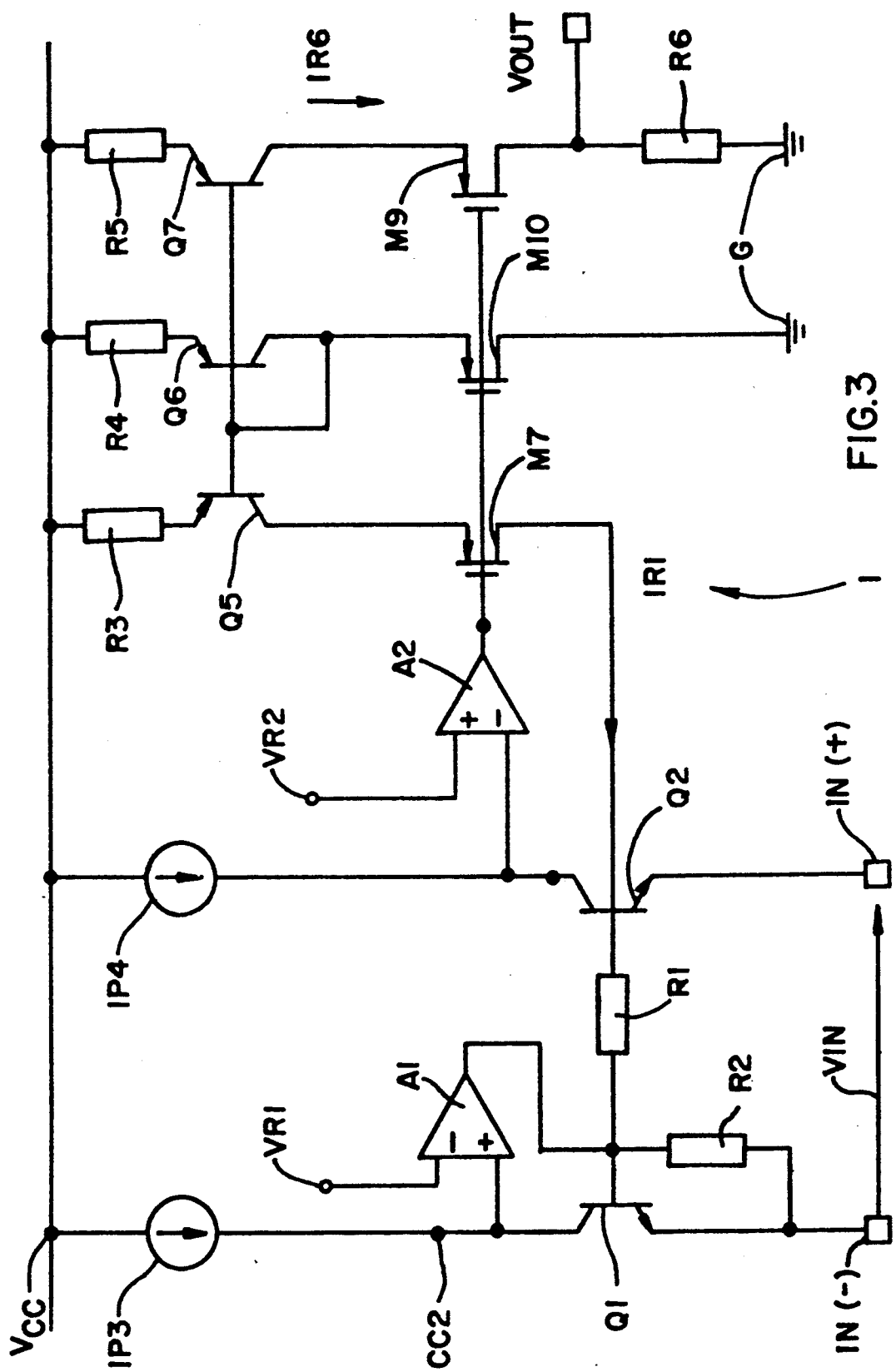
FIG. 3 shows the structure of the circuit of an amplifier according to the invention.

The general circuit diagram of the amplifier according to the invention is indicated 1 in FIG. 3.

Within this structure, the input signal is applied between two terminals indicated IN(−) and IN(+) respectively, which are connected to the emitters of two NPN bipolar transistors Q1 and Q2, the bases of which are coupled by means of a resistor R1. The base of the transistor Q1 is connected, on the one hand, to the emitter of the same transistor, by means of a resistor R2 and, on the other hand, to the output of a differential amplifier A1, the inverting input of which is connected to a reference voltage VR1 and the non-inverting input of which is connected to the collector of the transistor Q1. The same collector is also supplied by a current generator IP3 which is connected to the general supply line of the amplifier, which is assumed to be brought to a supply voltage Vcc, for example, of the order of 5 volts, which is common to all the elements of the circuit. A substantially identical connection arrangement is adopted for a current generator IP4 which supplies the collector of the transistor Q2. The same collector is connected to the inverting input of a further differential amplifier A2, the non-inverting input of which is connected to a further reference voltage VR2. The output of the amplifier A2 is connected to the gates of three P-channel MOS transistors M7, M10 and M9. The drain electrode of the MOS M7 transfers a current IR1 to the base of the transistor Q2 and hence to the first resistor R1 and the source electrode of the same transistor M7 is connected to the collector of a PNP bipolar transistor Q5, the emitter of which is connected, by means of a resistor R3, to the common supply line Vcc of the circuit.

The drain electrode of the MOS series pass transistor M10 is connected to the earth G of the circuit and the source of the same MOS M10 is connected to the collector of a further PNP bipolar transistor Q6, the emitter of which is connected to the common supply line Vcc of the circuit, by means of a resistor R4. It will be noted that the collector and the base of the bipolar transistor Q6 are short-circuited.

Finally, the drain of the MOS M9 is connected to the ground G by means of a resistor R6, from the terminals of which the output voltage VOUT of the amplifier is taken. The source of the MOS M9 is connected to the collector of a PNP bipolar transistor Q7, the emitter of which is connected to the supply line Vcc by means of a resistor R5.

In the circuit configuration described, the emitter of Q1 can go below the ground voltage since its collector is kept at the voltage VR1 by means of A1. Similarly, the collector voltage of Q2 is kept at VR2 by means of A2 and the MOS M7.

Since the bipolar transistors Q1 and Q2 are biased by two constant-current generators (IP3 and IP4), their base-emitter voltages (Vbe) may be considered approximately constant. In these circumstances, an input signal VIN applied as the voltage difference between IN(+) and IN(−) is transferred to the terminals of R1. In practice, the voltage, indicated VR1, at the terminals of R1 is approximately equal to the input voltage VIN.

The current necessary for the voltage VR1 to be present at the terminals of R1 is supplied by the MOS M7 and is equal to IR1=VR1/R1, in which, naturally, R1 is the resistance of the corresponding resistor.

The current IR1 is supplied by M7 through the current-mirror circuit formed by the bipolar transistors Q5, Q6, Q7 and the MOS transistors M7, M9 and M10. The gate voltage of M10 is regulated by the output of A2 so that, after it has been mirrored in the branch formed by the transistor Q5, the MOS M7 and the resistor R3, the current in the branch including the MOS M10 and the bipolar transistor Q6 and the resistor R4 equals the current IR1 calculated above (taking account of the ratio between the areas of Q5 and Q6 and of the ratio between the values of R3 and R4). In these circumstances, if the area of Q7 is made equal to that of Q5 and the value of R5 is made equal to that of R3, the current in Q7 will be equal to IR1 without any error due to the bias currents of Q5, Q6 and Q7. IR1 is thus mirrored into R6 without error due to the bias current and with a "cascode" both at the input and at the output of the mirror formed by the MOS transistors, which make its resistance greater than would be the case if bipolar transistors were used.

If the ratio between the currents in the mirror is 1:1, the current in R6 (IR6) will be equal to that in R1, so that:

$$I_{R1} = I_{R6}$$
$$\text{VOUT} = R_6 \cdot I_{R1}$$
$$\text{VOUT} = \frac{R_6}{R_1} V_{IN}$$

In other words, according to the terminology adopted in the claims which follow, IR6 constitutes a "replica" (identical, as in the example illustrated, or possibly amplified or attenuated) of IR1.

The maximum dynamic range at the input IN(+) is limited by the minimum voltage required in order for the input of the circuit for mirroring the current IR1 into R6 to be in its linear region. This minimum voltage is:

$$Vsm = VSDM7min + VECQ5 + VR3,$$

in which:
VSDM7min represents the minimum value of the voltage between the source and the drain of the MOS M7,
VECQ5 represents the voltage between the emitter and the collector of the transistor Q5, and
VR3 represents the voltage at the terminals of the resistor R3.

Assuming, for convenience, that all the resistors and the MOS and bipolar transistors in question are the same, it may be seen that:
VECQ5 is approximately equal to VEBQ6 (the base-emitter voltage of the transistor Q6) and hence approximately 0.7 volts,
a voltage drop in R3 of about 200 millivolts is possible, since the maximum current in R3 can easily be deduced by the foregoing equations, from the maximum input voltage to be admitted, and
a VDSM7 SAT (the voltage between the drain and the source of the MOS M7 in the saturation condition) of about 200 millivolts is possible if a suitable size for M7 is selected, in dependence on the maximum current IR1, which may be considered approximately equal to the maximum current R3 calculated in the previous point.

Under these circumstances, the maximum voltage, indicated VIN(+)max, which can be applied to the terminal IN(+), will be given by the equation:

$$VIN(+)max = Vcc - Vsm - VBEQ2,$$

in which Vcc is the common supply voltage of the circuit and VBEQ2 represents the base-emitter voltage of the transistor Q2. Assuming that Vcc is 5 volts and VBEQ2 is about 0.7 volts, VIN(+)max is thus about 3.2 volts.

Figure 4:
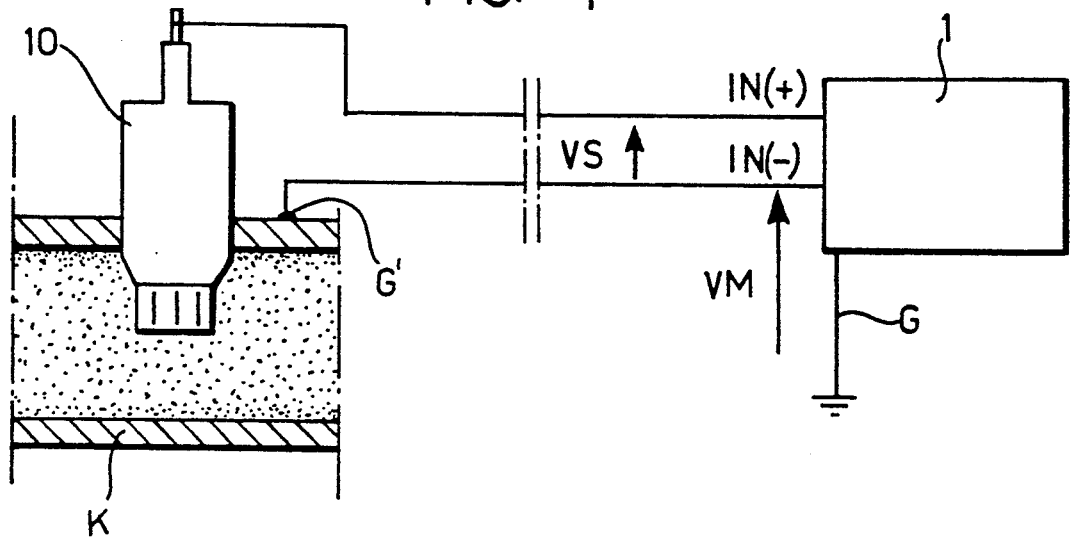
FIGS. 4 to 7 show in detail the context of application and some structural details of the invention.

This value is suitable for a lambda probe 10 fitted to a catalytic converter K (see in particular FIG. 4) and intended to be connected to a central control unit, the amplifier 1 acting as the input stage of the control unit and the output signal VS of the probe being taken from between its "hot" electrode and the earth G' of the converter K for application between the terminals IN(+) and IN(−), with the latter terminal at a voltage VM(±1 volt) relative to the earth G.

In particular, it is assumed that the lambda probe 10 brings to the input IN(−) a maximum voltage VMmax given by:

$$VSmax = VIN(+) - VIN(-) = +1 \text{ volt},$$

which gives as a result:

$$VIN(+)_{max} = VMmax + VSmax = 2 \text{ volts}.$$

Thus, it is possible to have a dynamic range suitable for the lambda probe, without using a supplementary voltage, by making use of a "cascode" mirror circuit. The restrictions on the input dynamic range IN(+) enable the calculation of minimum value VCQ2min of the dynamic range at the collector of Q2, which is:

$$VCQ2min = VIN(+)max + VCEQ2$$
$$sat = 3.2 + 0.3 = 3.5V,$$

in which VCEQ2sat indicates the saturation collector-emitter voltage of Q2 (about 0.2 volts).

This means that VR2 can be fixed at a value just greater than VCQ2min, and the current generators IP3 and IP4 can thus have wide dynamic ranges. The maximum dynamic range in R6 is limited by the dynamic range of the branch constituted by M9, Q7 and R5. This voltage is determined by the minimum voltage required at the output of the circuit for mirroring the current IR1 into R6 which, if the current ratio IR1/IR6 is unitary, corresponds to VSm, indicated above. This gives a maximum output voltage VOUTmax of:

$$VOUTmax = Vcc - Vsm = 5 - 0.2 - 0.7 - 0.2 = 3.9V.$$

With this dynamic range, a gain of 4 cannot be achieved in R6; if VSmax = 1V, VOUTmax would in fact have to be at least 4 V. It is therefore necessary to place in cascade an amplifier stage which outputs the required gain and dynamic range.

Figure 5:
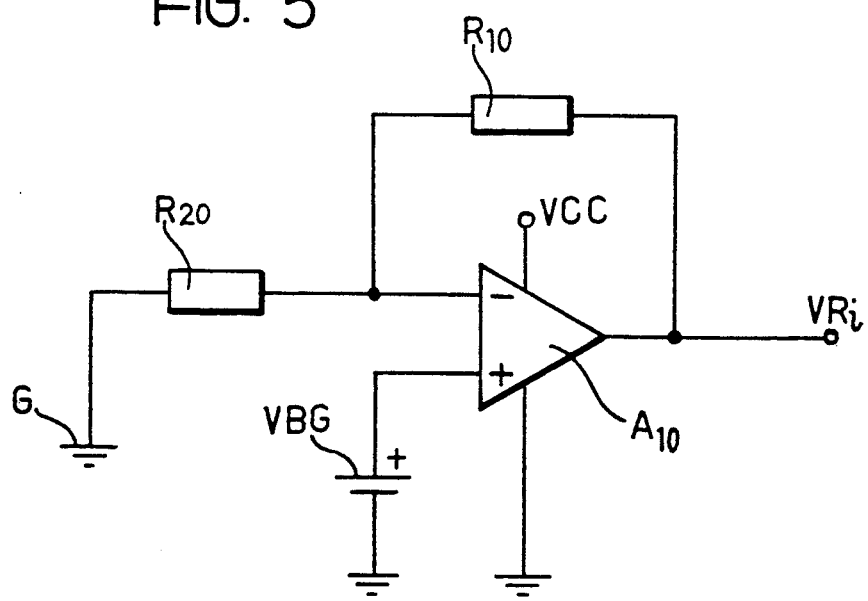

The reference voltages VR1 and VR2 are more effective, as regards the PSRR, if they are independent of the supply. This can be achieved by means of a structure such as that shown in FIG. 5, which may be considered known. In this drawing, VBG indicates a reference voltage independent of the supply voltage Vcc. The voltage VBG may be a "bandgap" voltage or the voltage drop in a resistance of which one end is connected to earth and the other end is supplied by a current generator independent of the supply. For this purpose the reference voltage VRi (where i = 1 or 2 in the diagram of FIG. 3) is thus taken from the output of a differential amplifier A10, to the non-inverting input of which VBG is applied, a resistor R10 being connected between the output and the inverting input of the same amplifier A10 and another resistor R20 being interposed between the inverting input and the earth G of the circuit. The amplifier A10 is supplied by the general voltage supply Vcc.

Finally, in order to have a high CMRR value and a low input offset voltage, it is necessary to prevent the absorption of current by the collectors of Q1 and Q2, which are already biased at very low current values (typically 0.5 μA), so as to have a high direct input resistance and thus to avoid charging of the probe. For this purpose, it is preferable to form the amplifier stages A1 and A2 of FIG. 3 with the use of the circuits shown in greater detail in FIGS. 6 and 7, in which the structures of the amplifiers A1 and A2 in question are shown with reference to their connections within the circuit of FIG. 3.

Figure 6:
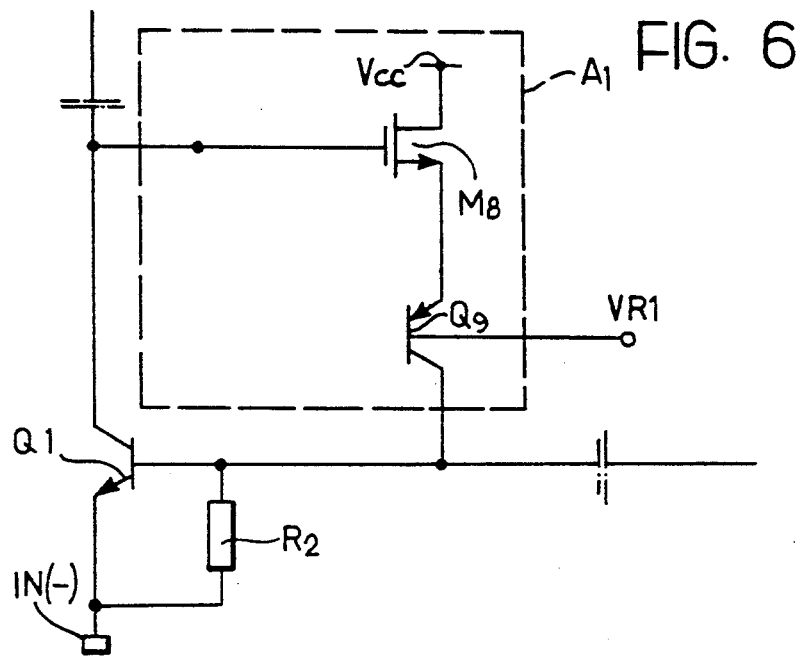
Figure 7:
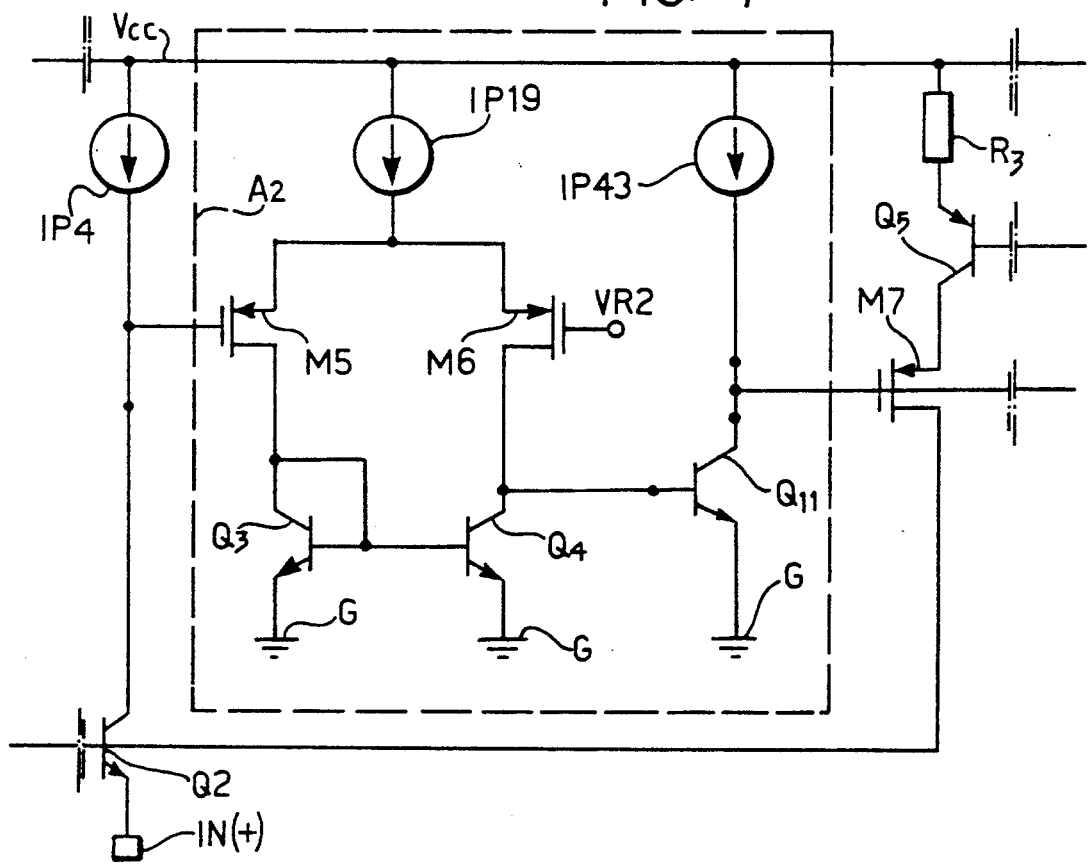

In particular, both the amplifiers in question are formed with MOS transistor input stages, indicated M8 for the amplifier A1 of FIG. 6, and M5 for the amplifier A2 of FIG. 7, respectively.

With reference, in particular, to the amplifier A1, it will be noted that the gate of the MOS M8 is intended to be connected to the collector of the transistor Q1 and the drain of the MOS M8 is connected to the supply line Vcc.

The source of the MOS M8, however, is connected to the emitter of a further bipolar transistor Q9, the collector of which is connected to the base of the transistor Q1 and hence to the opposite lead of the resistor R1 from the transistor Q2.

The maximum voltage at the input IN(−) which the amplifier makes available to the probe (which, as has been seen, would require only 1 V), can be expressed by the equation:

$$VIN(-)max + VBEQ1 + VECQ9sat - VEBQ9 = VR1$$

in which, naturally, VBEQ1 represents the base-emitter voltage of the transistor Q1, VECQ9SAT represents the voltage between the emitter and the collector of the transistor Q9 in the saturated condition, and VEBQ9 represents the emitter-base voltage of the same transistor.

If it is assumed that VR1 is 2.5 V and VBEQ1 is approximately equal to VEBQ9, with VECQ9sat about 0.3 V, a VIN(−)max of about 2.2 V is obtained.

The maximum fixed voltage VCQ1max at the collector of Q1, however is:

$$VCQ1max = VR1 + VEBQ9 + VGSM8 = 2.5 + 0.7 + 1 = 4.2V,$$

in which, naturally, VGSM8 represents the voltage between the gate and the source of the MOS M8.

This value does not permit a "cascode" to be formed in IP3 since if Vcc=5 V, the dynamic range available would be too small. In practice, the voltage VIP3$_{max}$ at the terminals of P3 would have a value which can be expressed by the equation:

$$VIP3max = Vcc - VCQ1max = 5 - 4.2 = 0.8V$$

in which VCQ1max represents the maximum value of the voltage at the collector of Q1.

If A1 is formed as shown in FIG. 6, in order to have a high output impedance, IP3 must therefore be formed with a transistor, the emitter of which is degenerated by a resistance. If it is essential to form the generators IP3 and IP4 with "cascodes", it is necessary to change the structure of A1 so as to reduce the voltage difference between its non-inverting and inverting inputs. Naturally, this can be done by increasing the gain of A1 which will therefore require a complex structure needing a larger area of silicon.

As regards the structure of A2 (FIG. 7), it will be noted that the drain of the MOS M5 is connected to the collector of a bipolar transistor Q3, the base and the collector of which are short-circuited and the emitter of which is connected to the ground G. The source of the MOS M5 is supplied by a current generator IP19 which is connected to the supply voltage Vcc which also supplies the source of another MOS M6, the gate of which is connected to the reference voltage VR2. The drain of the MOS M6 is connected to the collector of a bipolar transistor Q4, the base of which is connected to the base of the transistor Q3 and the emitter of which is connected to the ground G. The collector of the transistor Q4 (and hence the drain of the MOS M6) drives the base of a further bipolar transistor Q11, the emitter of which is connected to the ground G and the collector of which is intended to drive the gate of the MOS M7 (and thus constitutes the output of the amplifier A2) and is supplied by a further current generator IP43 which is connected to the supply voltage Vcc.

As stated, the advantages of the invention consist essentially of the fact that it provides an amplifier, particularly an amplifier which can be integrated, which has high CMRR and PSRR values, with inputs which can move relative to the ground by plus or minus 1 V in common mode and which, at the same time, can accept a maximum difference of 1 V between the input IN(+) and the input IN(−), the amplifier having a single supply Vcc of the order of 5 V and a high input impedance.

This is all made possible by innovation circuitry whose operation can be summarised in the following terms.

In the first place, bipolar input transistors Q1 and Q2 are used and are biased with constant currents, their emitters being connected to the inputs IN(+) and IN(−) which can fall to a voltage below that of the ground, since their respective collectors are kept at fixed reference voltages VR1 and VR2 (which are positive relative to the ground) by the amplifiers A1, A2, thus preventing the substrate diode from conducting.

Moreover, the selection of a very low value (less than 1 $\mu$A, for example 0.5 $\mu$A) for the currents produced by the generators IP3 and IP4 which supply the collectors of the input transistors Q1 and Q2, enables the direct current to be absorbed by the input generator at the input IN(+), to be only 0.5 $\mu$A whilst, for alternating current, the high resistances of the inputs are limited essentially by the so-called R$_o$ (or 1/h$_{oe}$) of the transistors Q1, Q2 and by the gains of the amplifiers A1 and A2.

Thirdly, a circuit is used to reflect the current IR1 from the resistance R1 into the resistance R6, which has a terminal connected to the ground. This is achieved by controlling the gate voltage of the MOS M10. A variation in this voltage will vary the voltage between the gate and the source of M10, thus varying the current in the transistor Q6 and the current in the resistor R4, which constitute the input of a mirror. A first output of the mirror, which is constituted by the MOS M7, the transistor Q5 and the resistor R3 (the first branch of the circuit), will supply the current IR1 which is controlled by the feedback loop by means of the gain of the amplifier A2, in dependence on the input voltage in the terms described in detail above. A second output of the mirror is constituted by the MOS M9, the transistor Q7 and the resistor R5 (the second branch of the circuit) in order to supply current to the resistor R6. The ratio between the areas of Q5 and Q7 and the ratio of the resistances of R3 and R5 determines the ratio between the current in R6 and the current IR1 so that either a unitary value or a value other than 1 may be selected for this ratio.

At the same time, the two branches mentioned are nor affected by errors due to the currents for biasing the bases of the transistors Q5 and Q7, since both collect at the collector of Q6 (which, together with the MOS M10 and the resistor R4, define a third arm of the current-mirror circuit, which is structurally identical to the first two branches). In particular, although the current in Q6 is the input current of the mirror, it may differ both from IR1 and from the current in R6. The current in R6 is thus the current IR1 multiplied by the ratio indicated above, without errors due to the bias currents, the error due to the difference between the base-emitter voltages of the transistors Q5 and Q7 being attenuated by means of the resistors R3 and R5 at their respective emitters. Moreover, the current in R6 has an error due to the Early voltages of the transistors Q5 and Q7, but this is attenuated by the "cascode" formed by the MOS M7 and the MOS M9. This is achieved while retaining a high input dynamic range at the drain of the MOS M7. The use of an MOS transistor (or any other similar device with a negligible input bias current) for M7 increases the common-mode rejection rates of the inputs.

Moreover, an amplifier A1 with high input impedance is used and, with the dynamic-range characteristics given by a sensor such as a lambda probe, and with a supply voltage of the order of 5 V, can be optimised as shown in FIG. 6. In this diagram, the MOS M8 prevents the absorption of current by the collector of the transistor Q1. No offset voltage is thus introduced to the inputs IN(+) and IN(−). Moreover, since M8 is a MOS transistor, the CMRR value is increased; in fact, a variation in the current in Q9 and M8 as a result of the Early effect due to Q9 causes no variation in the bias current of Q1 (which is fixed by IP3) and no variation in the current in the mirror and hence at the output.

Moreover, the use, as the amplifier A2, of a MOS structure with high input impedance and zero input bias current (M5, M6 in FIG. 7) avoids the introduction of an offset voltage at the inputs IN(+) and IN(−).

Naturally, the principle of the invention remaining the same, the details of construction and forms of embodiment may be varied widely with respect to those described and illustrated, without thereby departing from the scope of the present invention. In particular, although the selection of components such as bipolar transistors or MOS transistors in certain positions in the circuit is considered greatly preferable for the purposes of putting the invention into practice, it should not be considered absolutely binding for the purposes of the implementation thereof. In particular, the replacement of one or more of these components by functionally equivalent components is certainly possible and is therefore included within the scope of the present invention.

This applies particularly of the possibility, for example, of replacing bipolar transistors with field-effect transistors (for example MOSFETs) and vice versa. In this connection, for the purposes of defining the invention, the terms "collector", "base" and "emitter" as used in the following claims should be considered equivalent to the terms "drain", "gate" and "source", respectively, as far as the possibility of using one type of transistor instead of another is concerned. Naturally, the currently-preferred embodiment provides specifically for some functions to be entrusted to bipolar transistors and others to MOS transistors. In any case, as already stated, although this selection is preferred, it should not be considered essential.

We claim:

1. An integrated amplifier, including in combination:

an input stage including first and second transistors biased by respective bias current generators and having their emitters connected to define first and second input terminals of the amplifier; said two transistors having respective bases, connected together through a first resistor so that, in use, a voltage corresponding to the signal applied between said input terminals, appears at the terminals of said first resistor;

a first amplifier which is connected to said first transistor to hold the collector voltage thereof substantially constant;

a current mirror circuit including a first current generator connected to provide, in said first resistor, a first current corresponding to the voltage applied to the terminals of said first resistor; and a second current generator, coupled to said first current generator in a mirror relationship, and connected to supply at least one second resistor with a second current which constitutes a replica of the first current; whereby an output signal corresponding to the input signal can be taken from the terminals of the second resistor;

a second amplifier which is connected to said second transistor in such relation as to control said first current in response to voltage variations appearing on said second transistor; and a common supply line connected to supply power for said input stage and for said current-mirror circuit.

2. An amplifier according to claim 1, wherein one terminal of said second resistor is connected to ground.

3. An amplifier according to claim 1 wherein said two bias current generators each supply constant bias currents in the $\mu A$ range.

4. An amplifier according to claim 1, wherein said two bias current generators each supply a constant bias current of less than 1 $\mu A$.

5. An amplifier according to claim 4, wherein said two bias current generators each supply a constant bias current of about 0.5 $\mu A$.

6. An amplifier according to claim 1, wherein said two transistors in said input stage are NPN bipolar transistors.

7. An amplifier according to claim 1, wherein said current-mirror circuit includes:

a first branch which defines said first current generator, a second branch which defines said second current generator and is coupled to the first branch in a cascode-like current-mirror configuration.

8. An amplifier according to claim 7, wherein said current-mirror circuit also includes a third branch which is structurally symmetrical to said first branch and to said second branch, said third branch being interposed between said common supply line and said ground of the circuit, said first branch being interposed between said common supply line and said first resistor, and said second branch being interposed between the common supply line and the second resistor.

9. An amplifier according to claim 8 wherein said second amplifier also controls the gate voltage of a series pass transistor included in the third branch of said current-mirror circuit.

10. An amplifier according to claim 7, wherein each branch of said current-mirror circuit includes:

a respective bipolar transistor with its emitter connected to the common supply line and its base connected to the bases of the homologous transistors of the other branches of the current-mirror circuit, and a respective field-effect transistor, with its source connected to the first transistor and its gate connected to the gates of the homologous transistors of the branches of the current-mirror circuit.

11. An amplifier according to claim 10, wherein said respective bipolar transistor included in said third branch is connected in a generally diode-like configuration.

12. An amplifier according to claim 10, wherein the drains of said field-effect transistors included in said first and second branches of the current-mirror circuit are connected to said first resistor and to said second resistor, respectively.

13. An amplifier according to claim 10, wherein said drain of said field-effect transistor included in said third branch of said current-mirror circuit is connected to the ground of said current-mirror circuit.

14. An amplifier according to claim 10, wherein said bipolar transistor of said current-mirror circuit is a PNP bipolar transistor.

15. An amplifier according to claim 1 wherein said second amplifier is connected to control a field-effect transistor whereby the common-mode rejection rate of the inputs of the amplifier is improved.

16. An amplifier according to claim 1, wherein said first and second amplifiers each have a high input impedance so that the amplifier means do not substantially absorb current from the collectors.

17. An amplifier according to claim 1, wherein said first and second amplifiers each have a respective input stage comprising field-effect transistors.

18. An amplifier according to claim 1, wherein said first and second amplifiers operate from reference voltage levels generated by at least one reference voltage which is independent of said common supply line.

19. An amplifier according to claim 1, further comprising an additional resistor connected between said base and said emitter of said first transistor.

20. An amplifier according to claim 1, in combination with a lambda probe associated with a catalytic converter, the output signal of said probe being applied between said input terminals, and the ground voltage of said probe being unpredictably shifted relative to that of the amplifier.

21. The amplifier of claim 1, wherein said current mirror comprises third and fourth bipolar transistors, which are all of opposite type to said first and second transistors, and which have bases connected together; and wherein said fourth bipolar transistor is connected to provide current to said second resistor.

22. An integrated circuit amplifier, comprising:
first and second bipolar transistors, having respective emitters connected to provide first and second signal input terminals, and having respective bases connected together through a first resistor;
first and second bias current generators connected to supply collector current to said first and second transistors respectively;
a first differential amplifier which is connected to said first transistor to hold the collector voltage thereof substantially constant;
a current mirror circuit including
a first current generator connected to provide, in said first resistor, a first current corresponding to the voltage applied to the terminals of the first resistor; and
a second current generator, coupled to said first current generator in a mirror relationship, and connected to supply at least one second resistor with a second current corresponding to said first current;
a second differential amplifier which is connected to said second transistor in such relation as to control said first current in response to voltage variations appearing on said second transistor; and
a common supply line connected to supply power for said first and second bias-current generators and for said current-mirror circuit;
said second resistor being connected to provide an output signal which corresponds to the signal applied to said input terminals.

23. The amplifier of claim 22, wherein said first and second transistors are NPN transistors.

24. The amplifier of claim 22, wherein said current mirror comprises third, fourth, a fifth bipolar transistors, which are all of opposite type to said first and second transistors, and which have bases connected together; and wherein said fifth transistor is diode-connected; and wherein said fourth bipolar transistor is connected to provide current to said second resistor.

25. The amplifier of claim 22, wherein said current mirror comprises third and fourth bipolar transistors, which are all of opposite type to said first and second transistors, and which have bases connected together; and wherein said third bipolar transistor is connected to provide current to said first resistor through a first field-effect transistor which has a respective gate connected to be controlled by said second amplifier; and wherein said fourth bipolar transistor is connected to provide current to said second resistor through a second field-effect transistor which also has a respective gate connected to be controlled by said second amplifier.

26. An integrated circuit amplifier, comprising:
first and second bipolar transistors, having respective emitters connected to provide first and second signal input terminals, and having respective bases connected together through a first resistor;
first and second bias current generated connected to supply collector current to said first and second transistors respectively;
a first differential amplifier which is connected to said first transistor to hold the collector voltage thereof substantially constant;
a current mirror circuit including
a first current generator connected to provide, into said first resistor through a cascode stage, a first current corresponding to the voltage applied to the terminals of said first resistor; and
a second current generator, coupled to said first current generator in a mirror relationship, and connected to supply at least one second resistor with a second current corresponding to said first current;
a second differential amplifier which is connected to supply said cascode stage with a voltage which varies in response to voltage variations appearing on the collector of said second transistor; and
a common supply line connected to supply power for said first and second bias-current generators and for said current-mirror circuit;
said second resistor being connected to provide an output signal which corresponds to the signal applied to said input terminals.

27. The amplifier of claim 26, wherein said first and second transistors are NPN transistors.

28. The amplifier of claim 26, wherein said cascode stage comprises a field-effect transistor having a gate connected to be driven by said second amplifier.

29. The amplifier of claim 26, wherein said current mirror comprises third, fourth, and fifth bipolar transistors, which are all of opposite type to said first and second transistors, and which have bases connected together; and wherein said fifth transistor is diode-connected; and wherein said fourth bipolar transistor is connected to provide current to said second resistor; and wherein said third bipolar transistor is connected to provide current to said first resistor through a first field-effect transistor which has a respective gate connected to be controlled by said second amplifier; and wherein said cascode stage comprises a field-effect transistor having a gate connected to be driven by said second amplifier; and wherein said fourth bipolar transistor is connected to provide current to said second resistor through a second field-effect transistor which also has a respective gate connected to be controlled by said second amplifier.

30. An integrated circuit amplifier, comprising:
first and second bipolar transistors, having respective emitters connected to provide first and second signal input terminals, and having respective bases connected together through a first resistor;
first and second bias current generators connected to supply collector current to said first and second transistors respectively;
a first differential amplifier which is connected to said first transistor to hold the collector voltage thereof substantially constant;
a current mirror circuit which is connected to source a first current to said first resistor through a cascode stage, and to supply at least one second resistor with a second current corresponding to said first current;
a second amplifier which is connected to supply said cascode stage with a voltage which varies in response to voltage variations appearing on the collector of said second transistor; and
a common supply line connected to supply power for said first and second bias-current generators and for said current-mirror circuit;
said second resistor being connected to provide an output signal which corresponds to the signal applied to said input terminals.

31. The amplifier of claim 30, wherein said first and second transistors are NPN transistors.

32. The amplifier of claim 30, wherein said first differential amplifier is connected to first reference voltage input connection, and said second amplifier is connected to a second reference voltage input connection which is separate from said first reference voltage input connection.

33. The amplifier of claim 30, wherein said cascode stage comprises a field-effect transistor having a gate connected to be driven by said second amplifier.

34. The amplifier of claim 30, wherein said current mirror comprises third, fourth, and fifth bipolar transistors, which are all of opposite type to said first and second transistors, and which have bases connected together; and wherein said fifth transistor is diode-connected; and wherein said fourth bipolar transistor is connected to provide current to said second resistor.

35. The amplifier of claim 30, wherein said current mirror comprises third, fourth, and fifth bipolar transistors, which are all of opposite type to said first and second transistors, and which have bases connected together; and wherein said fifth transistor is diode-connected; and wherein said fourth bipolar transistor is connected to provide current to said second resistor; wherein said third bipolar transistor is connected to provide current to said first resistor through a first field-effect transistor which has a respective gate connected to be controlled by said second amplifier; and wherein said fourth bipolar transistor is connected to provide current to said second resistor through a second field-effect transistor which also has a respective gate connected to be controlled by said second amplifier.

36. An integrated circuit amplifier, comprising:
first and second bipolar transistors, having respective emitters connected to provide first and second signal input terminals, and having respective bases connected together through a first resistor, said first transistor having the base and emitter thereof interconnected through an additional resistor;
first and second bias current generators connected to supply collector current to said first and second transistors respectively;
a first differential amplifier which is operatively connected to supply said base of said first transistor with a voltage which varies in response to voltage variations appearing on said collector of said second transistor;
a current mirror circuit which is connected to source a first current to said first resistor through a cascode stage, and to supply at least one second resistor with a second current corresponding to said first current; and
a second amplifier which is connected to supply said cascode stage with a voltage which varies in response to voltage variations appearing on the collector of said second transistor; and
said second resistor being connected to provide an output signal which corresponds to the signal applied to said input terminals.

37. The amplifier of claim 36, wherein said first and second transistors are NPN transistors.

38. The amplifier of claim 36, wherein said first differential amplifier is connected to first reference voltage input connection, and said second amplifier is connected to a second reference voltage input connection which is separate from said first reference voltage input connection.

39. An integrated circuit amplifier, comprising:
first and second NPN bipolar transistors, having respective emitters connected to provide first and second signal input terminals, and having respective bases connected together through a first resistor;
first and second bias current generators connected to source current to said first and second transistors respectively from a positive power supply line;
a first differential amplifier which is operatively connected to drive said base of said first transistor with a voltage which varies in response to voltage variations appearing on said collector of said second transistor;
a current mirror circuit comprising a first PNP transistor operatively connected to source current from said positive power supply line to said first resistor, and a first additional transistor interposed between said first PNP transistor and said first resistor; and a second PNP transistor which has a base connected to the base of said first PNP transistor, and an emitter operatively connected to said positive power supply line, and a collector operatively connected to source current to a second resistor; and
a second differential amplifier which is connected to supply said first additional transistor stage with a voltage which varies in response to voltage variations appearing on the collector of said second transistor;

said second resistor being connected to provide an output signal corresponding to the voltage across said input terminals.

40. The amplifier of claim 39, wherein said current mirror comprises respective emitter resistors connected to said first and second PNP transistors.

41. The amplifier of claim 39, wherein said second PNP transistor is connected to provide current to said second resistor through a second additional field-effect transistor which also has a respective gate connected to be controlled by said second amplifier.

* * * * *

UNITED STATES PATENT AND TRADEMARK OFFICE
CERTIFICATE OF CORRECTION

PATENT NO. : 5,276,405
DATED : January 4, 1994
INVENTOR(S) : Mazzucco et al.

It is certified that error appears in the above-identified patent and that said Letters Patent is hereby corrected as shown below:

Title page, item [73], insert--
Assignees: SGS-Thomson Microelectronics, S.r.l.
Agrate Brianza (Milano), Italy Marelli Autronica, S.p.A.
Milano, Italy--.

Signed and Sealed this

Thirtieth Day of August, 1994

Attest:

BRUCE LEHMAN

Attesting Officer        Commissioner of Patents and Trademarks